United States Patent
Penich et al.

(10) Patent No.: US 8,500,966 B2
(45) Date of Patent: *Aug. 6, 2013

(54) NANOLAYERED COATED CUTTING TOOL AND METHOD FOR MAKING THE SAME

(75) Inventors: Ronald M. Penich, Greensburg, PA (US); Parag L. Hegde, Monroeville, PA (US); Aharon Inspektor, Pittsburgh, PA (US)

(73) Assignee: Kennametal Inc., Latrobe, PA (US)

( * ) Notice: Subject to any disclaimer, the term of this patent is extended or adjusted under 35 U.S.C. 154(b) by 1941 days.

This patent is subject to a terminal disclaimer.

(21) Appl. No.: 11/098,200

(22) Filed: Apr. 4, 2005

(65) Prior Publication Data
US 2005/0170219 A1    Aug. 4, 2005

Related U.S. Application Data

(60) Continuation of application No. 10/634,433, filed on Aug. 5, 2003, now Pat. No. 6,884,499, which is a division of application No. 10/097,487, filed on Mar. 14, 2002, now Pat. No. 6,660,133.

(51) Int. Cl.
*C23C 14/00* (2006.01)
*C23C 14/32* (2006.01)

(52) U.S. Cl.
USPC ............ 204/192.16; 204/192.12; 204/192.13; 204/192.15

(58) Field of Classification Search
USPC ............. 204/192.12, 192.16, 192.13, 192.15; 428/216; 429/99; 438/627
See application file for complete search history.

(56) References Cited

U.S. PATENT DOCUMENTS

| | | | |
|---|---|---|---|
| 4,540,596 | A | 9/1985 | Nimmagadda |
| 4,554,201 | A | 11/1985 | Andreev et al. |
| 4,599,281 | A | 7/1986 | Schintimeister et al. |
| 4,643,951 | A | 2/1987 | Keem et al. |
| 4,686,156 | A | 8/1987 | Baldoni, II et al. |
| 4,714,660 | A | 12/1987 | Gates, Jr. |
| 4,753,854 | A | 6/1988 | Gavrilov et al. |
| 4,776,863 | A | 10/1988 | van den Berg et al. |
| 4,835,062 | A | 5/1989 | Holleck |

(Continued)

FOREIGN PATENT DOCUMENTS

| | | |
|---|---|---|
| DE | 3532733 | 6/1986 |
| EP | 0446375 | 9/1991 |

(Continued)

OTHER PUBLICATIONS

Machine translation of JP No. 07097679.*
Kawaka K et al., "Charaterization of multilayer films of Ti-Al-O-C-N system prepared by pulsed d.c. plasma-enhanced chemical vapor deposition", Elsevier-Sequoia S.A. Lausanne, Thin Solid Films, CH, vol. 390, No. 1-2 Jun. 30, 2001 pp. 64-69.
PCT/US03/06953—Notice of Transmittal of the International Search Report or the Declaration.

(Continued)

*Primary Examiner* — Michael Band
(74) *Attorney, Agent, or Firm* — Matthew W. Gordon, Esq.

(57) ABSTRACT

A nanolayered coated cutting tool that includes a substrate that has a surface with a coating on the surface thereof. The coating comprises a plurality of coating sets of alternating nanolayers of titanium nitride and titanium aluminum nitride wherein each coating set has a thickness up to about 100 nanometers. The coating includes a bonding region and an outer region. The bonding region comprises a plurality of the coating sets wherein the thickness of each coating set increases as the set moves away from the surface of the substrate. The outer region comprises a plurality of the coating sets wherein the thickness of each coating set is about equal.

30 Claims, 4 Drawing Sheets

U.S. PATENT DOCUMENTS

| | | | |
|---|---|---|---|
| 4,842,710 A | | 6/1989 | Freller et al. |
| 4,871,434 A | * | 10/1989 | Munz et al. ............... 204/192.16 |
| 4,895,770 A | | 1/1990 | Schintlmeister et al. |
| 4,984,940 A | | 1/1991 | Bryant et al. |
| 5,071,693 A | | 12/1991 | Sue et al. |
| 5,075,181 A | | 12/1991 | Quinto et al. |
| 5,208,102 A | | 5/1993 | Schulz et al. |
| 5,252,360 A | | 10/1993 | Huttl et al. |
| 5,266,389 A | | 11/1993 | Omori et al. |
| 5,328,875 A | | 7/1994 | Ueda et al. |
| 5,330,853 A | | 7/1994 | Hofmann et al. |
| 5,368,939 A | | 11/1994 | Kawamura et al. |
| 5,478,634 A | | 12/1995 | Setoyama et al. |
| 5,503,912 A | | 4/1996 | Setoyama et al. |
| 5,549,975 A | | 8/1996 | Schulz et al. |
| 5,588,975 A | | 12/1996 | Hammond et al. |
| 5,656,383 A | | 8/1997 | Tanaka et al. |
| 5,679,448 A | | 10/1997 | Kawata |
| 5,687,679 A | | 11/1997 | Mullin et al. |
| 5,700,551 A | | 12/1997 | Kukino et al. |
| 5,712,030 A | | 1/1998 | Goto et al. |
| 5,736,458 A | * | 4/1998 | Teng ............................ 438/627 |
| 5,783,295 A | | 7/1998 | Barnett et al. |
| 5,833,021 A | | 11/1998 | Mensa-Wilmot et al. |
| 5,853,873 A | | 12/1998 | Kukino et al. |
| 5,882,777 A | | 3/1999 | Kukino et al. |
| 5,882,778 A | | 3/1999 | Sugizaki et al. |
| 5,978,207 A | | 11/1999 | Anderson et al. |
| 5,981,049 A | | 11/1999 | Ohara et al. |
| 6,045,667 A | | 4/2000 | Moll |
| 6,051,113 A | | 4/2000 | Moslehi |
| 6,071,560 A | | 6/2000 | Braendle et al. |
| 6,077,596 A | | 6/2000 | Hashimoto et al. |
| 6,103,357 A | * | 8/2000 | Selinder et al. ............... 428/216 |
| 6,111,697 A | | 8/2000 | Merrill |
| 6,120,842 A | * | 9/2000 | Lu et al. .......................... 429/99 |
| 6,196,936 B1 | | 3/2001 | Meckel |
| 6,274,249 B1 | | 8/2001 | Braendle et al. |
| 6,306,266 B1 | | 10/2001 | Metin et al. |
| 6,309,738 B1 | * | 10/2001 | Sakurai ......................... 428/216 |
| 6,333,099 B1 | | 12/2001 | Strondl et al. |
| 6,620,299 B1 | * | 9/2003 | Fietzke et al. ............ 204/192.12 |

FOREIGN PATENT DOCUMENTS

| | | | |
|---|---|---|---|
| EP | 0592986 | | 4/1994 |
| EP | 0701982 | | 3/1996 |
| EP | 0709483 | | 5/1996 |
| EP | 0592986 | | 7/1998 |
| JP | 03193868 A | | 8/1991 |
| JP | 07097679 A | * | 4/1995 |
| JP | 07138736 A | | 5/1995 |
| JP | 08134629 A | | 5/1996 |
| JP | 2001-261951 | | 9/2001 |
| JP | 2003-165003 A | | 6/2003 |
| WO | WO 9844163 | | 10/1998 |
| WO | WO 9940233 A1 | * | 8/1999 |
| WO | WO 99/58738 | | 11/1999 |

OTHER PUBLICATIONS

PCT/US03/06953—International Search Report.

H. Curtins, Platit: A New Industrial Approach to Cathodic Arc Coating Technology, Surface and Coatings Technology 76-77 (1995) pp. 632-639.

S. Kadlac and J. Muell, "Sputtering Systems with Magnetically Enhanced Ionization for Ion Plating of TiN Films", J. Vac. Sci. Technol. A 8 (3), May/Jun. 1990 pp. 1318-1324.

Hsieh et al. "Deposition and Charaterization of TiAlON aand Multi-Layered TiN/TiAlON Coatings Using Unbalanced Magnetron Sputtering",Surf. and Coatings Tech. (1998) pp. 132-137.

Anderson et al.,"Deposition, Microstructure and Mechanical and Tribological Properties of Magnetron Sputtered TiN/TiAlON Multilayers",Surf and Coatings Tech.(2000) pp. 219-226.

Akari et al.,"Reduction in Macroparticles During the Deposition of TiN Films Prepared by Arc Ion Plating",Surface and Coating Technology 43/44(1990) pp. 312-323.

McCandlish et al.Processing and Properties of Nanostructured WC-Co, Nanostructured Materials vol. 1(1992) pp. 119-124.

Subramanian et al., "Review of MultiComponent and Multilayer Coatings for Tribological Applications", Wear, 165 (1993) pp. 85-95.

Chu,"Deposition and Properties of Polycrystalline TiN/NbN Superlattice Coatings", J. Vac. Sci. Technol. A 10(4), Jul./Aug. 1992 pp. 1604-1609.

Holleck, "Designing Advanced Coatings for Wear Protection ", Surface Engineering 1991 vol. 7 No. 2 pp. 137-144.

Holleck et al."Preparation and Behaviour of Wear-Resistant TiC/TiB2, and TiC/TiN Coatings with High Amounts of Phase Boundaries" Surf. and Coatings Technol. 36 (1988)pp. 707-714.

Holleck,"Summary Abstract Wear Resistant Carbide-Boride Composite Coatings" J. Vac. Sci. Technol. A 3(6) Nov./Dec. 1985 pp. 2345-2347.

Holleck,"Material Selection for Hard Coatings" J. Vac. Sci. Technol. A 4(6) Nov./Dec. 1986 pp. 2661-269.

Holleck, Multilayer Coatings-Influence of Fabrication Parameters on Constitution and Properties, Surface and Coatings Technology 41 (1990) pp. 179-190.

Holleck et al.,"Significance of Phase Boundaries in Wear Resistant TiC/TiB2 Materials High Tech Ceramics" Elsevier Sci. Publ. B.V. Amsterdam 1987 pp. 2609-2622.

English Abstract of JP 7018416 A2 to Atsuo.

English Abstract of JP 052106 A2 to Shinichi.

English Abstract of JP7268606 A2 to Atsuo, No date.

English Abstract of 7305181 A2 to Nobuhiko et al. No date.

English Abstract of JP 3120352 A2 to Naoya et al. No date.

G. Schneider et al., "Progree in Metallography", Werkstoff-Informationsgesellschaft, presented at 33rd Metallography Convention Sep. 15-17, 1999 held in Rostock, Germany 9pg.

Shieh et al., "Nanaostructure and Hardness of Titanium Aluminum Nitride Prepared by Plasma Enhanced Chemical Vapor Deposition", Thin Solid Films (2001), 39(1) pp. 101-108.

* cited by examiner

NANOLAYERED COATED CUTTING TOOL
AND METHOD FOR MAKING THE SAME

This application is a continuation of application Ser. No. 10/634,433 filed on Aug. 5, 2003, now U.S. Pat. No. 6,884,499 which is a divisional of U.S. patent application Ser. No. 10/097,487, filed Mar. 14, 2002, now U.S. Pat. No. 6,660,133.

FIELD OF THE INVENTION

The invention pertains to a multi-layered coated cutting tool and a method for making the same. More particularly, the invention pertains to a nanolayered coated cutting tool and a method for making the same. In this regard, a nanolayered coated cutting tool has a coating scheme that comprises adjacent coating nanolayers having thicknesses of about 100 nanometers or less.

BACKGROUND OF THE INVENTION

Multi-layered coated cutting tools demonstrate excellent metalcutting properties in certain circumstances. Typically, a multi-layered coated cutting tool comprises a substrate with a plurality of coating layers deposited thereon. In some cases the coating layers comprise a plurality of sets of alternating coating layers. In this regard, U.S. Pat. No. 6,103,357 to Selinder et al. for a MULTILAYERED COATED CUTTING TOOL shows a multi-layered non-repetitive coating scheme in which the layers have a thickness that ranges between 0.1 to 30 nanometers. PCT Patent Application WO98/44163 to Sjöstrand et al. for a MULTILAYERED COATED CUTTING TOOL shows a multi-layered repetitive coating scheme in which each repeat period has a thickness that ranges between 3 and 100 nanometers.

Other exemplary coating schemes comprise multi-layered titanium nitride/titanium aluminum nitride coatings deposited by physical vapor deposition (PVD) techniques. Such coating schemes are described in Hsieh et al., "Deposition and Characterization of TiAlN and multi-layered TiN/TiAlN coatings using unbalanced magnetron sputtering", Surface and Coatings Technology 108-109 (1998) pages 132-137 and Andersen et al., "Deposition, microstructure and mechanical and tribological properties of magnetron sputtered TiN/TiAlN multilayers", Surface and Coatings Technology 123 (2000) pages 219-226.

Even though multi-layered titanium nitride/titanium aluminum nitride coating schemes exist, for a coating to be effective it must possess a certain minimum adhesion to the substrate and it must exhibit a certain minimum hardness. It has always been, and still remains, a goal to improve the adhesion of the coating to the substrate of the coated cutting tool. In addition, it has always been, and still remains, a goal to optimize the hardness of the coated cutting tool. It has always been, and still remains, a goal to improve and optimize the combination of the properties of adhesion and hardness for a coated cutting tool.

It would thus be desirable to provide a coated cutting tool (e.g., a nanolayered coated cutting tool), as well as a method for making the coated cutting tool, wherein the cutting tool possesses improved adhesion and optimized hardness, as well as an improvement in the combination of the adhesion and hardness.

It would also be desirable to provide a metal nitride/metal aluminum nitride coated cutting tool (e.g., a nanolayered titanium nitride/titanium aluminum nitride coated cutting tool), as well as a method for making the coated cutting tool, wherein the cutting tool possesses improved adhesion and optimized hardness, as well as an improvement in the combination of the adhesion and hardness.

It would also be desirable to provide a metal aluminum nitride/metal aluminum carbonitride coated cutting tool (e.g., a nanolayered titanium aluminum nitride/titanium aluminum carbonitride coated cutting tool), as well as a method for making the coated cutting tool, wherein the cutting tool possesses improved adhesion and optimized hardness, as well as an improvement in the combination of the adhesion and hardness.

It would also be desirable to provide a metal nitride/metal aluminum nitride/metal aluminum carbonitride coated cutting tool (e.g., a nanolayered titanium nitride/titanium aluminum nitride/metal aluminum carbonitride coated cutting tool), as well as a method for making the coated cutting tool, wherein the cutting tool possesses improved adhesion and optimized hardness, as well as an improvement in the combination of the adhesion and hardness.

SUMMARY OF THE INVENTION

In one form, the invention is a nanolayered coated member that comprises a substrate that has a surface and a coating on the surface of the substrate. The coating comprises a plurality of coating sets of nanolayers wherein a set comprises alternating nanolayers of a nanolayer of a metal nitride (wherein the metal nitride may optionally include carbon and/or silicon) and a nanolayer of a metal aluminum nitride (wherein the metal aluminum nitride may optionally include carbon and/or silicon). The coating includes a bonding region and an outer region. The bonding region comprises a plurality of the coating sets wherein the thickness of a coating set generally increases as one moves away from the surface of the substrate. The outer region comprises a plurality of the coating sets. The metal may comprise titanium, niobium, hafnium, vanadium, tantalum, zirconium and/or chromium alone or in combination with each other or in combination with other metals including aluminum in the metal nitride layer so long as the composition of the metal nitride layer differs from that of the metal aluminum nitride layer.

In another form, the invention is a nanolayered coated member that comprises a substrate that has a surface and a coating on the surface of the substrate. The coating comprises a plurality of coating sets of nanolayers wherein a set comprises alternating nanolayers of a nanolayer of a metal aluminum nitride (wherein the metal aluminum nitride may optionally include carbon and/or silicon) and a nanolayer of a metal aluminum carbonitride (wherein the metal aluminum carbonitride may optionally include silicon). The coating includes a bonding region and an outer region. The bonding region comprises a plurality of the coating sets wherein the thickness of a coating set generally increases as one moves away from the surface of the substrate. The outer region comprises a plurality of the coating sets. The metal may comprise titanium, niobium, hafnium, vanadium, tantalum, zirconium and/or chromium alone or in combination with each other or in combination with other metals.

In yet another form, the invention is a nanolayered coated member that comprises a substrate that has a surface and a coating on the surface of the substrate. The coating comprises a plurality of coating sets of nanolayers wherein a set comprises alternating nanolayers of a nanolayer of a metal nitride (wherein the metal nitride may optionally include carbon and/or silicon), a nanolayer of a metal aluminum nitride (wherein the metal aluminum nitride may optionally include carbon and/or silicon), and a nanolayer of a metal aluminum carbonitride (wherein the metal aluminum carbonitride may optionally include silicon). The coating includes a bonding region and an outer region. The bonding region comprises a plurality of the coating sets wherein the thickness of a coating set generally increases as one moves away from the surface of the substrate. The outer region comprises a plurality of the coating sets. The metal may comprise titanium, niobium, hafnium, vanadium, tantalum, zirconium and/or chromium alone or in combination with each other or in combination with other metals including aluminum in the metal nitride layer so long as the composition of the metal nitride layer differs from that of the metal aluminum nitride layer and metal aluminum carbonitride layer.

In still another form thereof, the invention is a process for making a nanolayered coated member, the process comprising the steps of: providing a substrate having a surface; providing a metal target (wherein the metal target may optionally include carbon and/or silicon); providing a metal-aluminum target (wherein the metal-aluminum target may optionally include carbon and/or silicon); rotating a substrate between the metal target and the metal-aluminum target; supplying electrical power at a first level of electrical power to the metal target; supplying electrical power at the first level to the metal-aluminum target; depositing a coating comprising coating sets of alternating nanolayers on the surface of the substrate; changing the deposition rate of the alternating nanolayers over a selected period of time during which electrical power supplied to the metal target changes from the first level to a second level; and controlling the deposition rate of the alternating nanolayers for a period of time after the electrical power reaches the second level. The metal may comprise titanium, niobium, hafnium, vanadium, tantalum, zirconium and/or chromium alone or in combination with each other or in combination with other metals including aluminum in the metal target so long as the composition of the metal target differs from that of the metal-aluminum target.

In still another form thereof, the invention is a process for making a nanolayered coated member, the process comprising the steps of: providing a substrate having a surface; providing a metal-aluminum target (wherein the metal-aluminum target may optionally include carbon and/or silicon); providing a metal-aluminum-carbon target (wherein the metal-aluminum-carbon target may optionally include silicon); rotating a substrate between the metal-aluminum target and the metal-aluminum-carbon target; supplying electrical power at a first level to the metal-aluminum target; supplying electrical power at the first level to the metal-aluminum-carbon target; depositing a coating comprising coating sets of alternating nanolayers on the surface of the substrate; changing the deposition rate of the alternating nanolayers over a selected period of time during which electrical power supplied to the metal-aluminum target and the metal-aluminum-carbon target changes from the first level to a second level; and controlling the deposition rate of the alternating nanolayers for a period of time after the electrical power reaches the second level. The metal may comprise titanium, niobium, hafnium, vanadium, tantalum, zirconium and/or chromium alone or in combination with each other or in combination with other metals.

In still another form thereof, the invention is a process for making a nanolayered coated member, the process comprising the steps of: providing a substrate having a surface; providing a metal target (wherein the metal target may optionally include carbon and/or silicon); providing a metal-aluminum target (wherein the metal-aluminum target may optionally include carbon and/or silicon); providing a metal-aluminum-carbon target (wherein the metal-aluminum-carbon target may optionally include silicon); rotating a substrate between the metal target and the metal-aluminum target and the metal-aluminum-carbon target; supplying electrical power at a first level to the metal target; supplying electrical power at the first level to the metal-aluminum target; supplying electrical power at the first level to the metal-aluminum-carbon target; depositing a coating comprising coating sets of alternating nanolayers on the surface of the substrate; changing the deposition rate of the alternating nanolayers over a selected period of time during which electrical power supplied to the metal target and to the metal-aluminum target and to the metal-aluminum-carbon target changes from the first level to a second level; and controlling the deposition rate of the alternating nanolayers for a period of time after the electrical power reaches the second level. The metal may comprise titanium, niobium, hafnium, vanadium, tantalum, zirconium and/or chromium alone or in combination with each other or in combination with other metals including aluminum in the metal target so long as the composition of the metal target differs from that of the metal-aluminum target and the metal-aluminum-carbon target.

BRIEF DESCRIPTION OF THE DRAWINGS

The following is a brief description of the drawings that form a part of this patent application.

DETAILED DESCRIPTION

Figure 1:
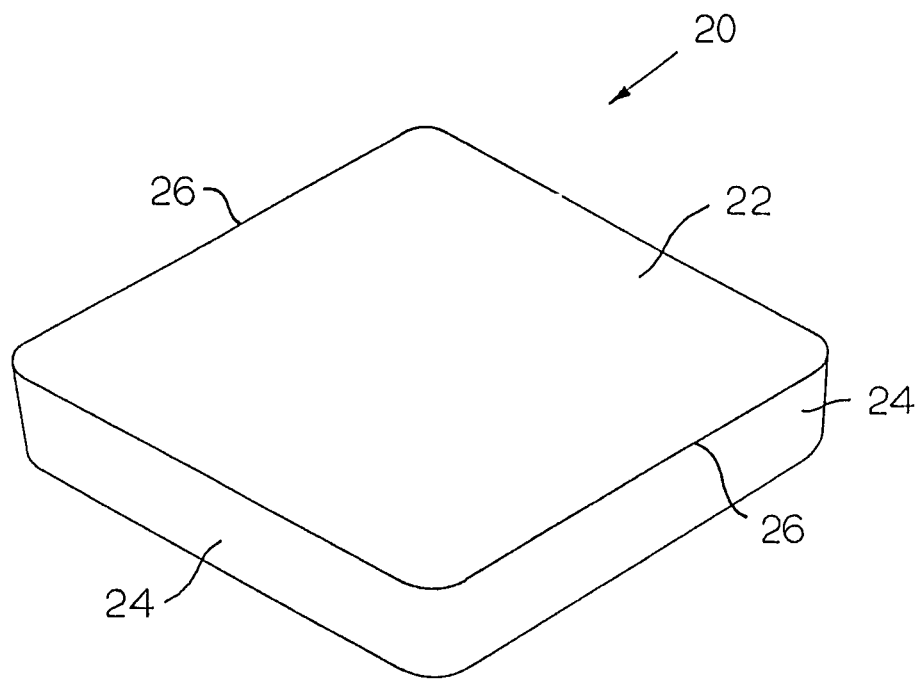
FIG. 1 is an isometric view of a specific embodiment of a nanolayered coated cutting tool.

Referring to the drawings, FIG. 1 illustrates a specific embodiment of a cutting tool generally designated as 20. Cutting tool 20 has a top rake surface 22 and flank surfaces 24. The top rake surface 22 intersects with the flank surfaces 24 so as to form cutting edges 26 at the intersections thereof.

Figure 2:
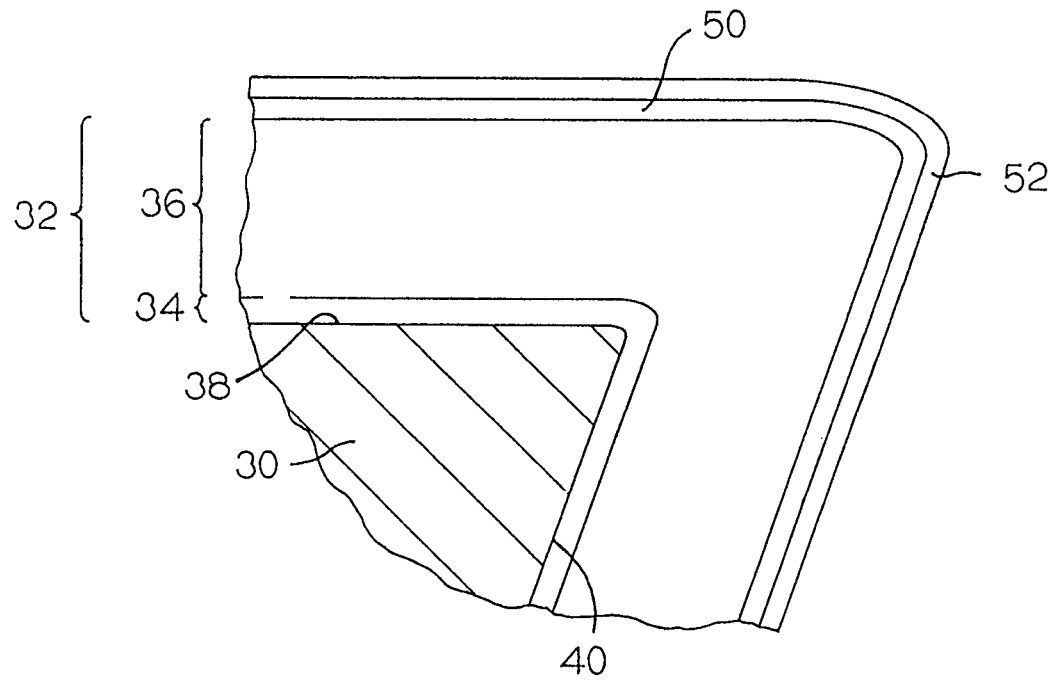
FIG. 2 is schematic cross-sectional view of a cutting edge of the nanolayered coated cutting tool of FIG. 1 showing the substrate with the nanolayered coating comprising a bonding region and an outer region, and also including a finishing layer and a lubricious layer.

As shown in FIG. 2, cutting tool 20 comprises a substrate 30 that has a nanolayered coating as shown by brackets 32. The nanolayered coating 32 comprises a bonding region as shown by the brackets 34 in FIG. 2. The bonding region 34 comprises one or more coating sets of nanolayers (and typically a plurality of coating sets of nanolayers) as described hereinafter. The nanolayered coating 32 also includes an outer region as shown by brackets 36 in FIG. 2. The outer region comprises a plurality of coating sets of nanolayers as described hereinafter.

FIG. 2 shows that the nanolayered coating 32 has been applied to the rake surface 38 and the flank surface(s) 40 of the substrate 30. However, it should be appreciated that there are instances in which the nanolayered coating 32 may only be applied to a selected one of the surfaces or selected portions of the surfaces of the substrate.

Referring to one arrangement of the nanolayered coating, the nanolayered coating may comprise two or more coating sets of alternating layers of materials wherein one of the materials is a metal nitride and the other material is a metal aluminum nitride (e.g., titanium nitride/titanium aluminum nitride or titanium aluminum nitride/titanium nitride). What this means is that in one specific coating scheme, the metal nitride (e.g., titanium nitride) layer may be the layer closest to (or actually on) the surface of the substrate. Yet, in another specific coating scheme, the metal aluminum nitride (titanium aluminum nitride) layer may be the layer closest to (or actually on) the surface of the substrate. Applicants contemplate that metal nitrides and metal aluminum nitrides of the following metals and their alloys would be acceptable for use in the nanolayered coating: titanium, niobium, hafnium, vanadium, tantalum, zirconium, and/or chromium alone or in combination with each other or in combination with other metals. The metal nitride layer may include aluminum so long as the composition of the metal nitride layer differs from that of the metal aluminum nitride layer. The metal nitride and the metal aluminum nitride each may include (as an optional component) carbon and/or silicon.

Still making general reference to another arrangement of the nanolayered coating, the nanolayered coating may comprise two or more coating sets of alternating layers of materials wherein one of the materials is a metal aluminum nitride and the other material is a metal aluminum carbonitride (e.g., titanium aluminum nitride/titanium aluminum carbonitride or titanium aluminum carbonitride/titanium aluminum nitride). What this means is that in one specific coating scheme, the metal aluminum nitride (e.g., titanium aluminum nitride) layer may be the layer closest to (or actually on) the surface of the substrate. Yet, in another specific coating scheme, the metal aluminum carbonitride (e.g., titanium aluminum carbonitride) layer may be the layer closest to (or actually on) the surface of the substrate. Along the lines of the metal nitride/metal aluminum nitride coating sets, applicants contemplate that the following metals and their alloys would be acceptable for use with the nanolayered coating: titanium, niobium, hafnium, vanadium, tantalum, zirconium, and/or chromium alone or in combination with each other or in combination with other metals. The metal aluminum nitride may include (as optional components) carbon and/or silicon. The metal aluminum carbonitride may include (as an optional component) silicon.

Referring to still another arrangement of the nanolayered coating, the nanolayered coating may comprise alternating layers of a metal nitride, a metal aluminum nitride and a metal aluminum carbonitride. Various arrangements of these nanolayers are presented as follows when the metal is titanium: titanium nitride/titanium aluminum nitride/titanium aluminum carbonitride or titanium aluminum carbonitride/titanium aluminum nitride/titanium nitride or titanium aluminum carbonitride/titanium nitride/titanium aluminum nitride or titanium aluminum nitride/titanium aluminum carbonitride/titanium nitride or titanium nitride/titanium aluminum carbonitride/titanium aluminum nitride or titanium aluminum nitride/titanium nitride/titanium aluminum carbonitride.

In one group of these arrangements with titanium as the metal, the titanium nitride layer may be the layer closest to (or actually on) the surface of the substrate. In this group, the titanium aluminum nitride layer and the titanium aluminum carbonitride layer are the other layers.

In another group of these arrangements, the titanium aluminum nitride layer may be the layer closest to (or actually on) the surface of the substrate. In this group, the titanium nitride layer and the titanium aluminum carbonitride layer are the other layers.

In still another group of the arrangements, the titanium aluminum carbonitride layer may be the layer closest to (or actually on) the surface of the substrate. In this group, the titanium nitride layer and the titanium aluminum nitride layer are the other layers.

Although the specific compounds for the coating arrangements set forth above are titanium nitride, titanium aluminum nitride and titanium aluminum carbonitride, applicants contemplate that other metal nitrides, metal aluminum nitrides and metal aluminum carbonitrides would be acceptable. In this regard, other metals and their alloys for the metal nitride, the metal aluminum nitride, and the metal aluminum carbonitride include niobium, hafnium, vanadium, tantalum, zirconium, and/or chromium alone or in combination with each other or in combination with other metals. The metal nitride layer may include aluminum so long as the composition of the metal nitride layer differs from the composition of the metal aluminum nitride layer and the metal aluminum carbonitride layer. In the above arrangements, the metal nitride (e.g., titanium nitride) and the metal aluminum nitride (e.g. titanium aluminum nitride) each may (as an option) include carbon and/or silicon. The metal aluminum carbonitride (e.g., titanium aluminum carbonitride) may as an optimal component include silicon.

Referring back to the specific coating scheme shown in FIG. 2, the bonding region 34 comprises a plurality of coating sets of alternating nanolayers of titanium nitride and titanium aluminum nitride. The purpose of the bonding region is to provide good adhesion between the coating and the substrate during usage (e.g., metalcutting applications). The bonding region has a thickness that ranges between about 0.025 micrometers and about 0.6 micrometers. More preferably, the bonding region has a thickness than ranges between about 0.05 micrometers and about 0.4 micrometers. Each nanolayer in the bonding region (whether it is a nanolayer of titanium nitride or a nanolayer of titanium aluminum nitride) has a thickness that may range between about 0.5 nanometers and about 5 nanometers, and more preferably, may range between about 0.5 nanometers and about 2 nanometers.

The thickness of the titanium aluminum nitride layer is typically different than the thickness of the titanium nitride layer. Generally speaking, the thickness of a coating layer varies due to one or more factors where in these factors are set out below without limitation.

The coating sets that comprise the bonding region are deposited during the so-called "ramp up" portion of the coating process. The "ramp up" portion of the process occurs during the initial part of the process in which the deposition rate is increased from a first level to a second level. Although it depends upon the time to complete the so-called "ramp up" portion of the process, the number of coating sets of layers may extend into the hundreds since each coating set has a thickness in the nanometer range (i.e., a thickness of less than about 100 nanometers).

As a result of this continuing increase in the deposition rate during the ramp up period, the thickness of the coating sets in the bonding region changes. More specifically, it is generally the case that as one moves away from the surface of the substrate, the thickness of each coating set increases (typically gradually) until the thickness of each coating set reaches a point at which the coating sets exhibit a generally consistent thickness. In the process, the deposition rate increases during the ramp up period, which results in the increase in thickness. The increase in deposition may be due to (without limitation) any one or more of the following factors: the gas composition in the chamber, the gas flow rate in the chamber, the sputtering rate of the target and/or the level of electrical power supplied to the target.

It should be appreciated that the increase in the thickness of each coating set may be due to each of the nanolayers increasing in thickness. As an alternative, the increase in the thickness of each coating set may occur when the thickness of one nanolayer remains substantially constant and the thickness of the other nanolayer increases.

In the process, for example, once the electrical power to the targets reaches the second level of electrical power, the electrical power preferably will be reduced for at least one of the targets to a level greater than the first level of electrical power for the remainder of the coating process to apply the outer region. The reduced level of electrical power may be different for each target. Also, the level of electrical power applied to each target may vary during the portion of the process to apply the outer region.

Referring to the bonding region, for example, the titanium nitride layer and the titanium carbonitride layer may include an aluminum content ranging from 0 to a higher level so long as the amount of aluminum is less than that contained in the titanium aluminum nitride layers and in the titanium aluminum carbonitride layers.

Still referring to FIG. 2, the plurality of coating sets that comprise the outer region are alternating nanolayers of titanium nitride and titanium aluminum nitride. The outer region has a thickness that ranges between about 1 micrometer and about 20 micrometers so long as there is good adhesion between the coating and the substrate in metalworking applications. More preferably, the outer region has a thickness that ranges between about 1 micrometer and about 10 micrometers. Each nanolayer (whether it is titanium nitride or titanium aluminum nitride) has a thickness that may range between about 0.5 nanometers and about 20 nanometers. More preferably, the thickness of each such nanolayer ranges between about 0.5 nanometers and about 10 nanometers. Most preferably, the thickness of each such nanolayer ranges between about 0.5 nanometers and about 2 nanometers.

The thickness of each coating set in the outer region may be substantially equal or the thicknesses may vary. In the situations in which the coating sets have a substantially equal thickness, the thickness of the nanolayers that make up the coating set, i.e., titanium nitride nanolayer and the titanium aluminum nitride nanolayer, may not necessarily be equal. In fact, as will be seen from the description hereinafter of the coating scheme in FIG. 3, the thickness of the titanium nitride nanolayer ranges between about 1 nanometer to about 2 nanometers and the thickness of the titanium aluminum nitride nanolayer ranges between about 10 nanometers to about 11 nanometers. In this regard, the thickness of the titanium nitride nanolayers in the bonding region also range between about 1 nanometer to about 2 nanometers while the thickness of the titanium aluminum nitride nanolayers increase as the coating sets move away from the substrate. Applicants contemplate that the titanium nitride nanolayer can preferably range in thickness between about 0.5 to about 2 nanometers. Applicants also contemplate that the titanium aluminum nitride nanolayer can preferably range in thickness between about 0.5 to about 11 nanometers.

As mentioned above, because the sputtering rate for the titanium-aluminum target is greater than the sputtering rate for the titanium target, generally speaking, the thickness of each nanolayer of titanium aluminum nitride may be greater than the thickness of each nanolayer of titanium nitride.

Referring to FIG. 2, layer 50 is a finishing layer that may comprise titanium nitride or titanium aluminum nitride. The thickness of finishing layer 50 is between about 0.1 micrometers and about 3 micrometer. Applicants contemplate that metal nitrides, metal aluminum nitrides and metal aluminum carbonitrides would be acceptable as the finishing layer. In this regard, other metals and their alloys for the metal nitride, the metal aluminum nitride, and the metal aluminum carbonitride include titanium, niobium, hafnium, vanadium, tantalum, zirconium, and/or chromium alone or in combination with each other or in combination with other metals. The finishing layer alternately or in addition to the above finishing layers may be an alumina layer. The finishing layer is typically applied by physical vapor deposition (PVD) techniques. Layer 52 is a lubricious layer that may comprise a material like molybdenum disulfide. The total thickness of finishing layer 50 and lubricious layer 52 is between about 0.1 micrometer and about 3 micrometers. The finishing layer and the lubricious layer are each optional layers for the coating scheme.

Still referring to FIG. 2, the substrate 30 is typically a hard material such as cemented carbide. One exemplary composition for the substrate 30, which is substrate A, is a cemented (cobalt) tungsten carbide material that has up to 0.1 weight percent tantalum, up to 0.1 weight percent niobium, up to 0.1 weight percent titanium, between about 0.3 and about 0.5 weight percent chromium, between about 5.7 weight percent and 6.3 weight percent cobalt with the balance being tungsten and carbon wherein most of the tungsten and carbide is in the form of tungsten carbide. The substrate has a hardness between about 92.6 and about 93.4 Rockwell A, a coercive force ($H_c$) of between about 250 and about 320 oersteds, a specific gravity of between about 14.80 and about 15.00 grams per cubic centimeter, a tungsten carbide grain size of 1-5 micrometers, and a magnetic saturation of between 167.7 and 191.9 microTesla cubic meter per kilogram cobalt. As will be discussed hereinafter, the coated cutting inserts used in the turning tests comprised a substrate of the same composition as substrate A.

Another exemplary composition for the substrate, which is substrate B, is a cemented (cobalt) tungsten carbide material that has between about 1.2 to about 2.5 weight percent tantalum, between about 0.3 to about 0.6 weight percent niobium, up to 0.4 weight percent titanium, between about 11 weight percent and 12 weight percent cobalt with the balance being tungsten and carbon wherein most of the tungsten and carbide is in the form of tungsten carbide. The substrate has a nominal hardness of about 89.8 Rockwell A, a coercive force ($H_c$) of between about 145 and about 185 oersteds, a specific gravity of between about 14.1 and about 14.5 grams per cubic centimeter, a tungsten carbide grain size of 1-6 micrometers, and a magnetic saturation of between 167.7 and 187.9 microTesla cubic meter per kilogram cobalt. As will be discussed hereinafter, the coated cutting inserts used in the milling tests comprised a substrate of the same composition as Substrate B.

The substrate may also be a cermet, a ceramic or a high speed steel, polycrystalline cubic boron nitride, polycrystalline diamond or diamond sheet or diamond film. The substrate may take the form of an indexable cutting insert, a cutting insert, a drill, milling cutter, end mill, reamer or tap made of any of the foregoing substrate materials.

The preferred adhesion strength of the coating to the surface of the substrate is at least 45 kilograms (kg). More preferably, the adhesion strength is at least 60 kg, and most preferably the adhesion strength is at least 100 kg. The test to determine the adhesion strength is a Rockwell A indentation test.

The preferable thickness of the entire nanolayered coating, exclusive of a finishing layer and a lubricious layer, is between about 1 micrometers and about 21 micrometers, and more preferably the thickness is between about 1 micrometers and about 11 micrometers, and most preferably the thickness of the entire nanolayered coating is between about 2 micrometers and about 6 micrometers.

Generally speaking, the process to produce the coatings comprises using a physical vapor deposition technique such as magnetron sputtering. In the following examples, the apparatus used to apply the coating was a Cemecon CC800/8 magnetron sputtering coating reactor. The coating reactor was configured so that the cutting insert substrates were rotated between two sets of targets. Each set of targets was disposed 180° from the other set. One of the sets of targets was two targets of titanium and the other set of targets was two titanium-aluminum targets. The substrate table was rotated at a rate of 0.8 revolutions per minute. The substrates were mounted on rotating planetary rod fixtures on the substrate table.

In these examples, the process comprises two basic portions. The first is the so-called "ramp up" portion which the power to the targets is increased from about 500 watts to a target power, such as, for example, about 8000 watts, over the course of about 45 minutes. Once the power reached its target, then as one alternative it is adjusted so as to remain constant (which may be, for example, 8000 watts or a lower electrical power level) throughout the balance of the coating process. As another option, the electrical power may be varied during the balance of the coating process. The nature of the variation may be, for example, as a sinusoidal wave or as a square tooth wave or as a saw tooth wave.

The following examples were made in a fashion generally consistent with the above description of the coating process. Each of the examples in Table I includes substrates that had a composition like that of Substrate A and substrates that had a composition like that of Substrate B. The titanium target was solid titanium metal. The titanium-aluminum target comprised a titanium metal target having forty-eight plugs of aluminum therein. The process parameters for each one of these examples are set forth in Table I below.

TABLE I

Process Parameters for Examples of
Titanium Nitride/Titanium Aluminum Nitride Nanolayer Coatings

| Example | Ti Target Power (KW) | TiAl Target Power (KW) | Argon Flow Rate (sccm) | Nitrogen Flow Rate (sccm) | Coating Time (hours) | Bias Current (Amps) | Nitrogen Partial Flow Rate |
|---|---|---|---|---|---|---|---|
| 274 | 4 | 6 | 175 | ~113 | 6 | 21 | 0.31 |
| 276 | 4 | 8 | 175 | ~120 | 6 | 26 | 0.32 |
| 277 | 8 | 4 | 175 | ~119 | 6 | 25 | 0.32 |
| 281 | 4 | 6 | 175/100 | ~180 | 6 | 20 | 0.5 |
| 418 | 1.6 | 8 | 210 | ~90 | 6 | 21 | .24 |
| 422 | 1.6 | 8 | 210 | ~88 | 6 | 20 | .24 |

In each one of these examples, the flow rate for the Krypton was 80 standard cubic centimeter per minute (sccm). In Table I the designation "sccm" for the argon and nitrogen flow rate is standard cubic centimeter per minute. In Table I the nitrogen partial flow rate equals the flow rate of nitrogen (sccm) divided by the sum of the flow rates of nitrogen, argon and Krypton (sccm). For Example 281 in Table I, the argon flow rate of 175 sccm existed at the start of the ramp up period and decreased during the ramp up period to a flow rate equal to 100 sccm which was maintained during the remainder of the coating process.

In the processing, there is control over the aluminum content of the titanium aluminum nitride depending upon the specific metalcutting application. For some applications it is generally preferred that the aluminum/titanium atomic ratio (Al/Ti atomic ratio) is less than 1.0. In these applications, a preferred range for the Al/Ti atomic ratio is between about 0.2 and about 0.9. For other applications it is generally preferred that the Al/Ti atomic ratio be greater than or equal to 1.0 wherein a preferred range for the Al/Ti atomic ratio is between 1.0 and about 2.5. The limitation of the higher end range is based upon the ability of the coated cutting insert to have adequate hardness for metalcutting applications.

To increase the Al/Ti atomic ratio one may increase the level of electrical power to the aluminum-containing target(s) and/or control the nitrogen partial flow rate. To obtain a maximum aluminum content with a constant electrical power to the aluminum-containing target(s), one can decrease the nitrogen partial flow rate. One preferred nitrogen partial flow rate is a rate below 0.5. A more preferred nitrogen partial flow rate is a rate below 0.4. A still more preferred nitrogen partial flow rate is a rate less than 0.35. If the nitrogen partial flow rate is below 0.2, then the adhesion and hardness of the layers decreases. Overall, the preferred range for the nitrogen partial flow rate is between 0.2 and 0.35.

Table II below sets forth the process parameters for Example 449. The ramp up for Example 449 was the same as for the earlier examples, except that the titanium targets were replaced by titanium-aluminum-carbon targets. Each titanium-aluminum-carbon target comprised twelve plugs of aluminum and twelve plugs of graphite in a titanium metal target.

TABLE II

Process Parameters for Example 449
(Titanium Aluminum Carbonitride/Titanium
Aluminum Nitride Nanolayer Coatings)

| Example | TiAlC Target Power (KW) | TiAl Target Power (KW) | Argon Flow Rate (sccm) | Nitrogen Flow Rate (sccm) | Coating Time (hours) | Bias Current (Amps) | Nitrogen Partial Flow Rate |
|---|---|---|---|---|---|---|---|
| 449 | 8 | 1.6 | 210 | 87 | 6 | 15 | 0.23 |

For the processing of Example 449, the flow of Krypton gas remained constant at a rate of 80 standard cubic centimeter per minute. In Table II the designation "sccm" for the argon and nitrogen flow rate is standard cubic centimeter per minute.

Table III below sets forth the process parameters for Example 394. The ramp up for Example 394 was the same as that for Example 449, except that the titanium-aluminum targets were replaced by titanium targets. Each titanium-aluminum-carbon target comprised twelve plugs of aluminum and twelve plugs of graphite in a titanium metal target.

TABLE III

Process Parameters for Example 394
(Titanium Aluminum Carbonitride/Titanium
Nitride Nanolayer Coatings)

| Example | TiAlC Target Power (KW) | Ti Target Power (KW) | Argon Flow Rate (sccm) | Nitrogen Flow Rate (sccm) | Coating Time (hours) | Bias Current (Amps) | Nitrogen Partial Flow Rate |
|---|---|---|---|---|---|---|---|
| 394 | 8 | 1.6 | 210 | 80 | 6 | 20 | 0.22 |

For the processing of Example 394, the flow of Krypton gas remained constant at a rate of 80 milliliters per minute. In Table III the designation "sccm" for the argon and nitrogen flow rate is standard cubic centimeter per minute.

Selected properties of the resultant coated cutting tool are set forth in Table IV below. These properties are the aluminum/titanium atomic ratio, the overall thickness of the coating in micrometers, the microhardness of the cutting tool in kilograms per square millimeter (kg/mm$^2$) as measured by a standard Vickers test at a 25 gram load and the indent adhesion strength of the coated cutting tool as measured in kilograms.

Referring to the analysis of the coating layers, a JEOL 6400 Scanning Electron Microscope (SEM) with an Oxford Industries INCA Energy 400 Dispersive X-Ray Spectroscopy (EDS) is used to collect compositional information about the coatings (i.e., the titanium aluminum nitride coatings). Oxford Industries is located at 130A Baker Avenue Ex, Concord, Mass. 01742 and JEOL USA, Inc. is located at 11 Dearborn, Peabody, Mass. 01960.

The coating is analyzed in the as deposited state with no additional sample preparation or conductive coating applied. X-Rays are collected using a 15KV accelerating voltage.

The coating must be a minimum of about 3 micrometers in thickness to prevent the excitation of the substrate by the electron beam (thicker coatings would be necessary if a higher accelerating voltage was used). A minimum of 5 spectra are collected and the results quantified. The apparent concentration of each element is equal to the intensity of that element in the sample times the weight percent of that element in the standard divided by the intensity of the element in the standard. This must then be corrected for inter-element effects so that the weight percent of the element is equal to the apparent concentration divided by the intensity correction. Atomic percentages are then calculated by dividing the weight percent by the atomic weight of the element. There are several methods of calculating intensity corrections. This particular analytical scheme uses a Phi-Rho-Z approach. Since correction factors are dependent on the composition of the sample, true concentrations are derived using an iterative calculation.

TABLE IV

Selected Properties of the Examples Using Substrate A

| Example | Al/Ti Atomic Ratio (%) | Thickness (μm) | Average Values of Vickers Microhardness (kg/mm$^2$) | Indent Adhesion Strength (kg) |
|---|---|---|---|---|
| 274 | 0.6 | 3.4/4.1/3.4 | 2770 ± 101 | >60 |
| 276 | 0.67 | 3.9/4.1/3.8 | 3051 ± 133 | >60 |
| 277 | 0.25 | 4.1/3.9/3.6 | 2856 ± 071 | >60 |
| 281 | 0.46 | 3.2/2.8/2.9 | 2767 ± 169 | >60 |
| 418 | 1.1 | 4.5/5.6/5.3 | 2774 ± 32 | >60 |

TABLE IV-continued

Selected Properties of the Examples Using Substrate A

| Example | Al/Ti Atomic Ratio (%) | Thickness (μm) | Average Values of Vickers Microhardness (kg/mm$^2$) | Indent Adhesion Strength (kg) |
|---|---|---|---|---|
| 422 | 1.18 | 3.6/3.6/4.0 | 2818 ± 245 | >60 |
| 394 | 0.24 [4.9 atomic % carbon present] | 4.2/4.1/4.0 | 3016 ± 133 | >60 |
| 449 | 0.36 [2.9 atomic % carbon present] | 4.4/4.2/3.9 | 2899 ± 260 | >60 |

The examples set out in Table IV used substrates that had a composition like that of Substrate A. For the properties listed in Table IV, applicants expect that the coated cutting inserts using a substrate that had a composition like Substrate B would exhibit the same or substantially similar properties.

Some of the examples were tested in a turning application. The turning parameters were: workpiece material was 304 stainless steel, the speed was 500 surface feet per minute (sfm) [152 meters per minute], the feed was 0.012 inches per revolution (ipr) [0.3 millimeters per revolution], the depth of cut was 0.080 inches (d.o.c.) [2 millimeters d.o.c.], and flood coolant. The cutting tool was a CNGP432 style of cutting tool with a negative 5 degrees lead angle and a sharp cutting edge. The results of the turning tests are set forth in Table III below.

The criteria for the tool life are as follows: uniform flank wear: 0.012 inches (0.3 millimeters); maximum flank wear: 0.016 inches (0.4 millimeters); nose wear: 0.016 inches (0.4 millimeters); crater wear: 0.004 inches (0.100 millimeters); chip width on rake: 0.020 inches (0.5 millimeters); and depth of cut notch: 0.016 inches (0.4 millimeters).

TABLE V

Tool Life (Minutes) for Turning of 304 Stainless Steel

| Example | Rep. 1 | Rep. 2 | Average | Std. Deviation |
|---|---|---|---|---|
| 277 | 18.00 | 14.30 | 16.15 | 2.62 |
| 274 | 14.93 | 23.56 | 19.24 | 6.11 |
| 281 | 12.46 | 11.00 | 11.73 | 1.03 |
| 276 | 27.28 | 21.66 | 24.57 | 3.97 |
| KC5010 [Comparative Example] | 14.00 | 16.00 | 15.00 | 1.41 |

For Comparative Example KC5010, the substrate had the same composition as Substrate A. The coating was a single layer of titanium aluminum nitride with a nominal thickness of about 4.0 micrometers. Still referring to Comparative Example KC5010, the Al/Ti ratio equaled about 1.0, and the microhardness equaled about 2500 Kg/mm$^2$. The KC5010 cutting tool is a prior art cutting tool available from Kennametal Inc. of Latrobe, Pa.

Figure 3:
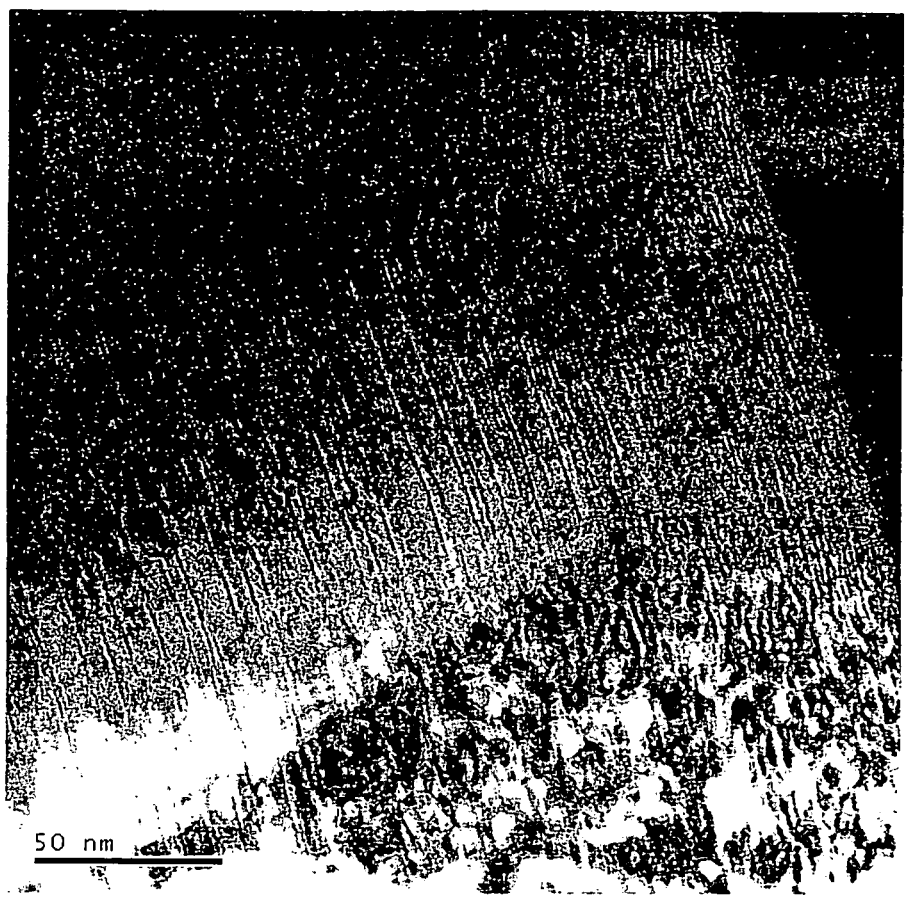
FIG. 3 is a photomicrograph taken via transmission electron microscopy (TEM) technique of the interface between the coating and the substrate for the nanolayered coated cutting tool of Example 276.

Referring to the photomicrograph FIG. 3, there is shown the bonding region and the outer region of the coating scheme from Example 276. For each one of the bonding region and the outer region there are alternating nanolayers of titanium nitride and titanium aluminum nitride. The dark nanolayers are titanium nitride and the light nanolayers are titanium aluminum nitride.

Figure 4:
FIG. 4 is a photomicrograph taken via transmission electron microscopy (TEM) technique of the mid-section of the coating for the nanolayered coated cutting tool of Example 276.
Figure 5:
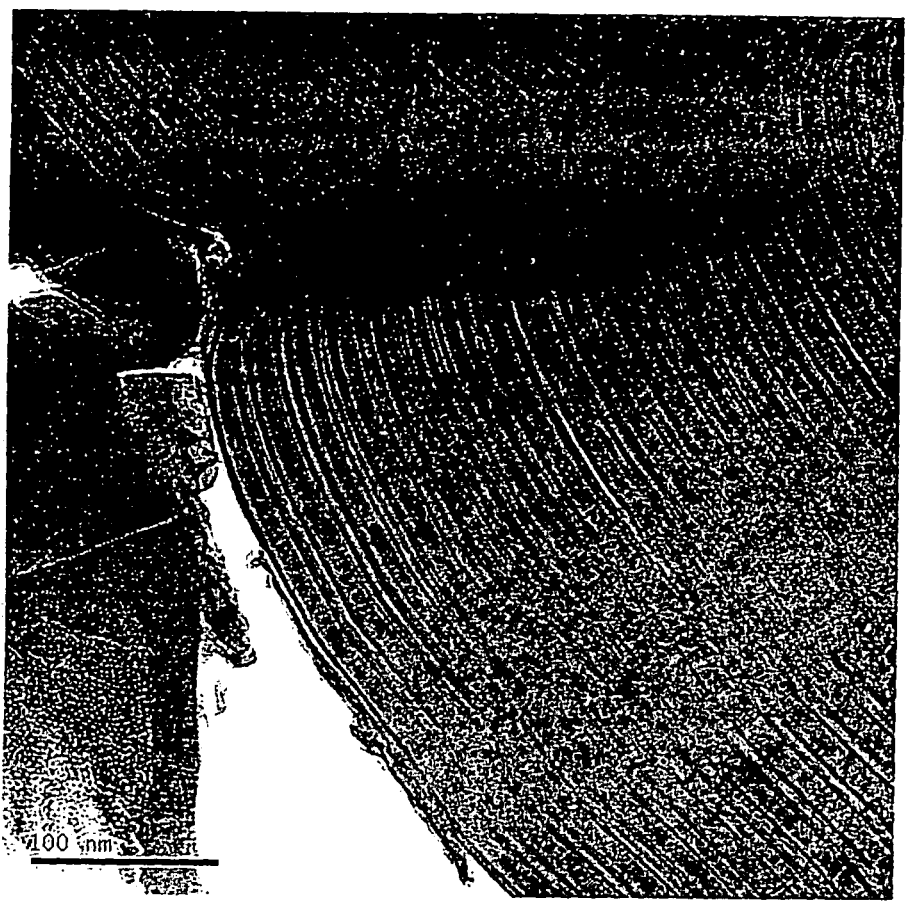
FIG. 5 is a photomicrograph taken via transmission electron microscopy (TEM) technique of the surface region of the coating for the nanolayered coated cutting tool of Example 276.

For FIG. 3, and also FIGS. 4 and 5, it should be appreciated that applicants believe that the visual contrast in darkness between the nanolayers shows that the titanium nitride nanolayers have no aluminum contained therein, or significantly less aluminum contained therein than do the titanium aluminum nitride nanolayers. It should be appreciated that the titanium nitride nanolayers are not necessarily pure titanium nitride since they may contain aluminum. To the extent there is aluminum contained in the titanium nitride nanolayers, this aluminum content may vary between the titanium nitride nanolayers. Applicants believe that the splotchy areas in the figures, and especially FIG. 3, are artifacts of TEM specimen preparation.

Referring to the bonding region, the nanolayers of titanium nitride have a thickness of between about 1 to 2 nanometers. The thickness of the titanium nitride nanolayers remains substantially constant throughout the bonding region. The thickness of the titanium aluminum nitride nanolayers begins at a range between about 1 to about 2 nanometers at and near the interface between the coating and the substrate. The substrate is the black area in the upper right-hand corner of the photomicrograph. The thickness of the titanium aluminum nitride layers increases as one moves away from the surface of the substrate. The thickness of the titanium aluminum nitride nanolayers increases to a range between about 10 to about 11 nanometers.

Referring to the photomicrograph FIG. 4, there is shown the bulk region of the coating scheme. The bulk region comprises alternating nanolayers of titanium nitride and titanium aluminum nitride wherein one nanolayer of titanium nitride and one nanolayer of titanium aluminum nitride comprises a coating set. The thickness of each nanolayer of titanium nitride is about equal and ranges between about 1 to about 2 nanometers. The thickness of each nanolayer of titanium aluminum nitride is about equal and ranges between about 10 nanometers to about 11 nanometers.

Referring to the photomicrograph FIG. 5, there is shown the region of the coating scheme that includes the outer surface thereof. This region of the coating scheme comprises alternating nanolayers of titanium nitride and titanium aluminum nitride wherein one nanolayer of titanium nitride and one nanolayer of titanium aluminum nitride comprises a coating set. The thickness of each nanolayer of titanium nitride is about equal and ranges between about 1 to about 2 nanometers. The thickness of each nanolayer of titanium aluminum nitride is about equal and ranges between about 10 nanometers to about 11 nanometers.

The examples were tested in a milling application. The milling parameters were: workpiece material was 4140 steel, the speed was 600 surface feet per minute (sfm) [183 meters per minute], the feed was 0.012 inches per revolution (ipr) [0.3 millimeters per revolution], the axial depth of cut (a.d.o.c.) was 0.100 inches [2.5 millimeters rdoc] and the radial depth of cut (r.d.o.c.) was 3.0 inches [75 millimeters rdoc], and flood coolant. The cutting tool was a SEHW43A6T style of cutting tool with a 45 degree lead angle and a T land of 0.2 millimeters and 20 degrees. The results of the milling tests are set forth in Table VI below.

The criteria for the tool life are as follows: uniform flank wear: 0.012 inches (0.3 millimeters); maximum flank wear: 0.016 inches (0.4 millimeters); nose wear: 0.016 inches (0.4 millimeters); crater wear: 0.004 inches (0.100 millimeters); and chip width on rake: 0.030 inches (0.75 millimeters). The examples set out in Table VI used a substrate that had a composition like Substrate B. Comparative Example KC525M is a cutting tool that has a substrate with a composition like that of Substrate B and a coating of titanium aluminum nitride wherein the coating has a nominal thickness of about 4 micrometers.

TABLE VI

Tool Life (Minutes) for Milling of 4140 Steel

| Example | Rep. 1 | Rep. 2 | Rep. 3 | Average Tool Life/Std. Deviation |
|---|---|---|---|---|
| 277 | 7.45 | 6.62 | 9.10 | 7.72/1.26 |
| 274 | 7.45 | 8.28 | 8.28 | 8.00/0.48 |
| 281 | 4.96 | 7.45 | 8.28 | 6.90/1.73 |
| 276 | 8.28 | 4.97 | 8.28 | 7.18/1.91 |
| KC525M [Comparative Example] | 4.97 | 4.97 | 6.62 | 5.52/0.96 |

The patents and other documents identified herein are hereby incorporated by reference herein.

Other embodiments of the invention will be apparent to those skilled in the art from a consideration of the specification or a practice of the invention disclosed herein. It is intended that the specification and examples are illustrative only and are not intended to be limiting on the scope of the invention. The true scope and spirit of the invention is indicated by the following claims.

What is claimed is:

1. A process for making a nanolayered coated member, the process comprising the steps of:
providing a substrate having a surface;
providing a metal target;
providing a metal aluminum target;
rotating a substrate between the metal target and the metal aluminum target;
supplying electrical power at a first metal target power level to the metal target wherein the first metal target power level is greater than zero;
supplying electrical power at a first metal-aluminum target power level to the metal aluminum target wherein the first metal-aluminum target power level is greater than zero;
depositing a coating comprising coating sets of alternating nanolayers;
changing the deposition rate of the alternating nanolayers over a selected period of time during which electrical power supplied to the metal target changes from the first metal target power level to a second metal target power level wherein the second metal target power level is greater than zero and the electrical power supplied to the metal-aluminum target changes from the first metal-aluminum target power level to a second metal-aluminum target power level wherein the second metal-aluminum target power level is greater than zero; and
controlling the deposition rate of the alternating nanolayers for a period of time after the electrical power supplied to the metal target reaches the second metal target power level and the electrical power supplied to the metal-aluminum target reaches the second metal-aluminum target power level.

2. The process according to claim 1 wherein the alternating nanolayers comprise a metal nitride and a metal aluminum nitride.

3. The process according to claim 2 wherein the depositing step includes depositing a plurality of coating sets of the alternating nanolayers of metal nitride and metal aluminum nitride during the time the electric power supplied to the metal target changes from the first metal target power level to the second metal target power level and the electrical power supplied to the metal-aluminum target changes from the first metal-aluminum target power level to the second metal-aluminum target power level so as to deposit a bonding region of the coating.

4. The process according to claim 3 wherein in the bonding region, the thickness of the metal-aluminum nitride nanolayer is different from the thickness of the metal nitride nanolayer.

5. The process according to claim 3 wherein each coating set included in the bonding region has a thickness, and the thickness of the coating sets in the bonding region increases moving away from the surface of the substrate.

6. The process according to claim 2 where the depositing step includes depositing a plurality of the coating sets of the alternating nanolayers during the time the electric power supplied to the metal target is maintained at the second metal target power level and the electrical power supplied to the metal-aluminum target is maintained at the second metal-aluminum target power level so as to deposit an outer region of the coating.

7. The process according to claim 6 wherein each coating set included in the outer region has a thickness, and the thickness of each one of the coating sets remaining about equal.

8. The process according to claim 6 wherein for the outer region the thickness of the metal aluminum nitride nanolayer is different from the thickness of the metal nitride nanolayer.

9. The process according to claim 6 further including depositing a finishing layer on the outer surface of the coating.

10. The process according to claim 9 further including depositing a lubricious layer on the surface of the finishing layer.

11. The process according to claim 1 further including supplying nitrogen at a pre-selected nitrogen partial flow rate.

12. The process according to claim 1 wherein the first metal target power level is less than the second metal target power level, and the first metal-aluminum target power level is less than the second metal-aluminum target power level.

13. A process for making a nanolayered coated member, the process comprising the steps of:
providing a substrate having a surface;
providing a metal-aluminum target;
providing a metal-aluminum-carbon target;
rotating a substrate between the metal-aluminum target and the metal-aluminum-carbon target;
supplying electrical power at a first metal-aluminum target power level to the metal-aluminum target wherein the first metal-aluminum target power level is greater than zero,
supplying electrical power at a first metal-aluminum-carbon target power level to the metal-aluminum-carbon target wherein the first metal-aluminum-carbon target power level is greater than zero;
depositing a coating comprising coating sets of alternating nanolayers;
changing the deposition rate of the alternating nanolayers over a selected period of time during which electrical power supplied to the metal-aluminum target changes from the first metal-aluminum target power level to a second metal-aluminum target power level wherein the second metal-aluminum target power level is greater than zero and the electrical power supplied to the metal-aluminum-carbon target changes from the first metal-aluminum-carbon target power level to a second metal-aluminum-carbon target power level wherein the second metal-aluminum-carbon target power level is greater than zero; and
controlling the deposition rate of the alternating nanolayers for a period of time after the electrical power supplied to the metal-aluminum target reaches the second metal-aluminum target power level and the electrical power supplied to the metal-aluminum-carbon target reaches the second metal-aluminum-carbon target power level.

14. The process according to claim 13 wherein the alternating nanolayers comprise a metal-aluminum-nitride and a metal-aluminum-carbonitride.

15. The process according to claim 14 wherein the depositing step includes depositing a plurality of coating sets of alternating nanolayers of the metal-aluminum-nitride and the metal-aluminum-carbonitride during the time the electric power supplied to the metal-aluminum target changes from the first metal-aluminum target power level to the second metal-aluminum target power level and the electrical power supplied to the metal-aluminum-carbon target changes from the first metal-aluminum-carbon target power level to the second metal-aluminum-carbon target power level so as to deposit a bonding region of the coating.

16. The process according to claim 15 wherein each coating set included in the bonding region has a thickness, and the thickness of the coating sets in the bonding region increases moving away from the surface of the substrate.

17. The process according to claim 14 wherein the depositing step further includes depositing a plurality of coating sets of alternating nanolayers during the time the electric power supplied to the metal target is maintained at the second metal-aluminum target power level and the electrical power supplied to the metal-aluminum-carbon target is maintained at the second metal-aluminum-carbon target power level so as to deposit an outer region of the coating.

18. The process according to claim 17 wherein each one of the coating sets included in the outer region has a thickness, and the thickness of the coating sets remaining about equal.

19. The process according to claim 17 wherein for the outer region the metal aluminum nitride layer has a thickness and the metal aluminum carbonitride layer has a thickness, and the thickness of the metal aluminum carbonitride layer being different from the thickness of the metal aluminum nitride layer.

20. The process according to claim 17 further including depositing a finishing layer on the outer surface of the coating.

21. The process according to claim 20 further including depositing a lubricious coating on the surface of the finishing layer.

22. The process according to claim 13 wherein the first metal-aluminum target power level is less than the second metal-aluminum-carbon target power, and the first metal-aluminum target power level is less than the second metal-aluminum-carbon target power level.

23. A process for making a nanolayered coated member, the process comprising the steps of:
providing a substrate having a surface;
providing a metal target;
providing a metal aluminum target;
providing a metal-aluminum-carbon target;
rotating a substrate between the metal target and the metal aluminum target and the metal-aluminum-carbon target;
supplying electrical power at a first metal target power level to the metal target wherein the first metal target power level is greater than zero;
supplying electrical power at a first metal-aluminum target power level to the metal-aluminum target wherein the first metal-aluminum target power level is greater than zero;

supplying electrical power at a first metal-aluminum-carbon target power level to the metal-aluminum-carbon target wherein the first metal-aluminum-carbon target power level is greater than zero;

depositing a coating comprising coating sets of alternating nanolayers;

changing the deposition rate of the alternating nanolayers over a selected period of time during which electrical power supplied to the metal target changes from the first metal target power level to a second metal target power level wherein the second metal target power level is greater than zero and electrical power supplied to the metal-aluminum target changes from the first metal-aluminum target power level to a second metal-aluminum target power level wherein the second metal-aluminum target power level is greater than zero and electrical power supplied to the metal-aluminum-carbon target changes from the first metal-aluminum-carbon target power level to a second metal-aluminum-carbon target power level wherein the second metal-aluminum-carbon target power level is greater than zero; and controlling the deposition rate of the alternating nanolayers for a period of time after the electrical power supplied to the metal target reaches the second metal target power level and the electrical power supplied to the metal-aluminum target reaches the second metal-aluminum target power and the electrical power supplied to the metal-aluminum-carbon target reaches the second metal-aluminum-carbon target power level.

24. The process according to claim 23 wherein the alternating nanolayers comprise a metal nitride and a metal aluminum nitride and a metal aluminum carbonitride.

25. The process according to claim 24 wherein the depositing step includes depositing a plurality of coating sets of alternating nanolayers of metal nitride and metal aluminum nitride and a metal aluminum carbonitride during the time that the electrical power supplied to the metal target changes from the first metal target power level to the second metal target power level and the electrical power supplied to the metal-aluminum target changes from the first metal-aluminum target power level to the second metal-aluminum target power level and the electrical power supplied to the metal-aluminum-carbon target changes from the first metal-aluminum-carbon target power level to the second metal-aluminum-carbon target power level so as to deposit a bonding region of the coating.

26. The process according to claim 25 wherein each coating set included in the bonding region has a thickness and the thickness of each coating set increases moving away from the surface of the substrate.

27. The process according to claim 25 wherein the depositing step further includes depositing a plurality of alternating nanolayers of metal nitride and metal aluminum nitride and metal aluminum carbonitride during the time the electrical power supplied to the metal target is maintained at the second metal target power level and the electrical power supplied to the metal-aluminum target is maintained at the second metal-aluminum target power level and the electrical power supplied to the metal-aluminum-carbon target is maintained at the second metal-aluminum-carbon target power level so as to deposit an outer region of the coating.

28. The process according to claim 27 wherein each coating set included in the outer region has a thickness, and the thickness of each one of the coating sets remaining about equal.

29. The process according to claim 28 further including depositing a finishing layer on the outer surface of the coating.

30. The process according to claim 29 further including depositing a lubricious layer on the surface of the finishing layer.

* * * * *